United States Patent
Sun et al.

(10) Patent No.: US 9,922,996 B2
(45) Date of Patent: Mar. 20, 2018

(54) ARRAY SUBSTRATE, MANUFACTURING METHOD THEREFOR AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Jian Sun, Beijing (CN); Cheng Li, Beijing (CN); Seong Jun An, Beijing (CN); Bongyeol Ryu, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 571 days.

(21) Appl. No.: 14/364,024

(22) PCT Filed: Nov. 29, 2013

(86) PCT No.: PCT/CN2013/088146
§ 371 (c)(1),
(2) Date: Jun. 9, 2014

(87) PCT Pub. No.: WO2015/039381
PCT Pub. Date: Mar. 26, 2015

(65) Prior Publication Data
US 2016/0197096 A1    Jul. 7, 2016

(30) Foreign Application Priority Data
Sep. 22, 2013 (CN) .......................... 2013 1 0432359

(51) Int. Cl.
*H01L 27/12* (2006.01)
*H01L 33/42* (2010.01)
(Continued)

(52) U.S. Cl.
CPC .......... *H01L 27/124* (2013.01); *H01L 27/127* (2013.01); *H01L 27/1255* (2013.01);
(Continued)

(58) Field of Classification Search
None
See application file for complete search history.

(56) References Cited

U.S. PATENT DOCUMENTS 7,746,416 B2 * 6/2010 Wu .................. G02F 1/136213
345/87
2005/0117104 A1 * 6/2005 Nishida ............. G02F 1/134363
349/141
(Continued)

FOREIGN PATENT DOCUMENTS

CN    103268047 A    8/2013
CN    103268878 A    8/2013

OTHER PUBLICATIONS

Translation of Chinese Patent ID No. CN103268878A.*
(Continued)

*Primary Examiner* — Abul Kalam
(74) *Attorney, Agent, or Firm* — Ladas & Parry LLP (57) ABSTRACT

An array substrate is provided. The array substrate includes a base substrate, and a buffer layer, a semiconductor layer, a gate insulation layer, a gate metal layer, an interlayer dielectric layer, a source/drain metal layer and a pixel electrode layer that are subsequently formed on the base substrate, and a common electrode layer formed between the base substrate and the buffer layer. The array substrate has an increased storage capacitance and an improved maintenance ratio of pixel voltage, suppresses the unfavorable
(Continued)

phenomenon like flicker of the display device. A method for manufacturing an array substrate and a display device including such an array substrate are also provided.

13 Claims, 4 Drawing Sheets

(51) Int. Cl.
  *G02F 1/1362* (2006.01)
  *G02F 1/1368* (2006.01)

(52) U.S. Cl.
  CPC ........ *H01L 33/42* (2013.01); *G02F 1/136227* (2013.01); *G02F 1/136286* (2013.01); *G02F 2001/13685* (2013.01)

(56) References Cited

U.S. PATENT DOCUMENTS

2006/0001789 A1* 1/2006 Ahn .................. G02F 1/133345
  349/42
2007/0120116 A1    5/2007 Han
2013/0083092 A1*  4/2013 Shin ........................ G09G 3/36
  345/690
2013/0300968 A1* 11/2013 Okajima ........... G02F 1/136209
  349/43
2015/0311232 A1* 10/2015 Sun .................... G02F 1/136227
  257/72

OTHER PUBLICATIONS

Second Chinese Office Action Appln. No. 201310432359A; dated Aug. 14, 2015.
Written Opinion of the International Searching Authority Appln. No. PCT/CN2013/088146; dated Jul. 8, 2014.
International Search Report dated Jul. 8, 2014; Appln. No. PCT/CN2013/088146.
First Chinese Office Action Appln. No. 201310432359.1; dated May 20, 2015.

* cited by examiner

ARRAY SUBSTRATE, MANUFACTURING METHOD THEREFOR AND DISPLAY DEVICE

TECHNICAL FIELD

The embodiments of the present invention involve an array substrate and a manufacturing method therefor, and a display device.

BACKGROUND

With the development of the TFT (thin film transistor) crystal liquid display technology, the TFT display devices based on the LTPS (Low Temperature Poly-silicon) technology have become increasingly the mainstream in the mark due to characters such as low power consuming, high resolution, quick response speed, and high aperture ratio. Such kind of display devices have been widely applied in various electric appliances, for example, digital electronic devices such as liquid crystal televisions, smart phones, tablet computers and digital cameras.

However, among the products with high resolution such as the TFT display devices based on LTPS technology, as the product resolution and the aperture ratio become higher and higher, the pixel pitch in the array substrate of an LTPS TFT display device becomes smaller and smaller, and thus the storage capacitance of the array substrate become less and less. For an LTPS TFT array substrate, given the same leakage current, the smaller the storage capacitance is, the lower the maintenance ratio of pixel voltages is, which results in occurrence of the unfavorable phenomenon such as flicker, etc. and greatly impairs the quality of an array substrate and a product with high resolution such as a TFT display device. Therefore, it is desired to increase the storage capacitance without influencing the aperture ratio of an array substrate.

SUMMARY

The embodiments of the present invention provide an array substrate and a manufacturing method therefor, and a display device, to overcome the problem that an array substrate or a display device has low quality due to small storage capacitance of the array substrate.

In one aspect of the present invention, an array substrate is provided, the array substrate includes a base substrate, and a buffer layer, a semiconductor layer, a gate insulation layer, a gate metal layer, an interlayer dielectric layer, a source/drain metal layer and a pixel electrode layer that are formed subsequently on the base substrate, and a common electrode layer formed between the base substrate and the buffer layer.

For example, a horizontal projection area of the common electrode layer on the base substrate overlaps with a horizontal projection area of the pixel electrode layer on the base substrate and a horizontal projection area of the semiconductor layer on the base substrate, respectively.

For example, the semiconductor layer may be a poly-silicon layer.

For example, the source/drain metal layer includes patterns of a source electrode, a drain electrode and a data line, and the interlayer dielectric layer and the gate insulation layer is formed therein with a source electrode via and a drain electrode via respectively for electrically connecting the source electrode and the drain electrode with the semiconductor layer.

For example, the common electrode layer is formed by a transparent conductive material. For example, the transparent conductive material is ITO (Indium Tin Oxide).

In another aspect of the present invention, a display device is provided, and the display device includes any array substrate as described in the embodiments of the present invention.

In still another aspect of the present invention, a method for manufacturing an array substrate is provide, the method includes: forming a common electrode layer on a base substrate; and forming a buffer layer, a semiconductor layer, a gate insulation layer, a gate metal layer, an interlayer dielectric layer, a source/drain metal layer and a pixel electrode layer on the common electrode layer For example, a horizontal projection area of the common electrode layer on the base substrate overlaps with a horizontal projection area of the pixel electrode layer on the base substrate and a horizontal projection area of the semiconductor layer on the base substrate, respectively.

For example, the semiconductor layer may be a poly-silicon layer.

For example, the source/drain metal layer includes patterns of a source electrode, a drain electrode and a data line. The method further includes: after forming the interlayer dielectric layer and before forming the source/drain metal layer, forming a source via and a drain via in the interlayer dielectric layer and the gate insulation layer respectively for electrically connecting the source electrode and the drain electrode with the semiconductor layer.

In the array substrate as provided by the present invention, the common electrode layer not only forms a storage capacitance with the pixel electrode layer, but also forms a storage capacitance with the semiconductor layer, which increases the storage capacitance of the array substrate, improving the maintenance ratio of pixel voltage of the array substrate, suppressing the undesirable phenomenon such as flicker and the like of the display device, and improving the quality of the array substrate and the display device. In addition, in the method for manufacturing an array substrate as provided by the present invention, because the subsequent process for forming a protection layer and a passivation layer are omitted, it is possible to simplify the film layer structure of the array substrate and the corresponding manufacturing process.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

First Embodiment

Figure 1:
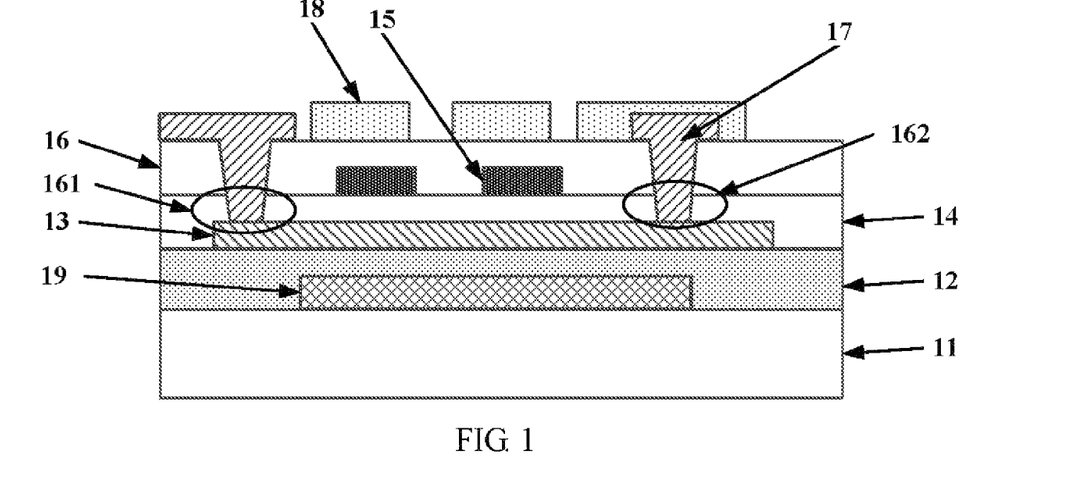
FIG. 1 is a schematic view showing the structure of the array substrate according to a first embodiment of the present invention.

FIG. 1 is a schematic view showing the structure of the array substrate according to the first embodiment of the present invention. The array substrate according to the first embodiment includes a base substrate 11, and a buffer layer 12, a semiconductor layer 13, a gate insulation layer 14, a gate metal layer 15, an interlayer dielectric layer 16, a source/drain metal layer 17 and a pixel electrode layer 18 that are subsequently formed on the base substrate 11. The array substrate further includes a common electrode layer 19 formed between the base substrate 11 and the buffer layer 12.

In particularly, the common electrode layer 19 may partially cover the base substrate 11, and the horizontal projection area of the common electrode layer 19 on the base substrate 11 respectively overlaps with the horizontal projection area of the pixel electrode layer 18 on the base substrate 11 and the horizontal projection area of the semiconductor layer 13 on the base substrate 11.

Furthermore, the common electrode layer 19 generally is formed by a transparent conductive material, and the transparent conductive material may be ITO (indium tin oxide), AZO (aluminum doped zinc oxide), or the like; there is no limitation thereto in the embodiment of the present invention.

Furthermore, the semiconductor layer 13 may be a poly-silicon layer or an amorphous silicon layer. For example, in the embodiment of the present invention, the semiconductor layer 13 typically is a poly-silicon layer.

Furthermore, the source/drain metal layer 17 generally includes patterns of a source electrode, a drain electrode and a data line, for which further description will not be given herein. Accordingly, the interlayer dielectric layer 16 and the gate insulation layer are formed with a source electrode via 161 and a drain electrode via 162 therein for respectively electrically connecting with the source electrode and the drain electrode with the semiconductor layer 13, for which further description will not be given herein.

In the present embodiment, before forming the buffer layer 12, a common electrode layer 19 may be formed on the base substrate 11, so that the common electrode layer 19 can form a storage capacitor not only with the pixel electrode layer 18 but also with the semiconductor layer 13. This structure functions to increase the capacitance of the array substrate, improve the maintenance ratio of pixel voltage of the array substrate, suppress the undesirable phenomenon such as flicker of the display device and improve the quality of the array substrate and the display device.

In addition, compared with the conventional technology, since the film layer structure such as a protection layer, a common electrode layer, a passivation layer, and so on, is not formed between the pixel electrode layer 18 and the source/drain metal layer 17 any more, the process for forming the subsequent protection layer and the passivation layer can be omitted, and thus the film layer structure of the array substrate and the manufacturing process are simplified.

Figure 2:
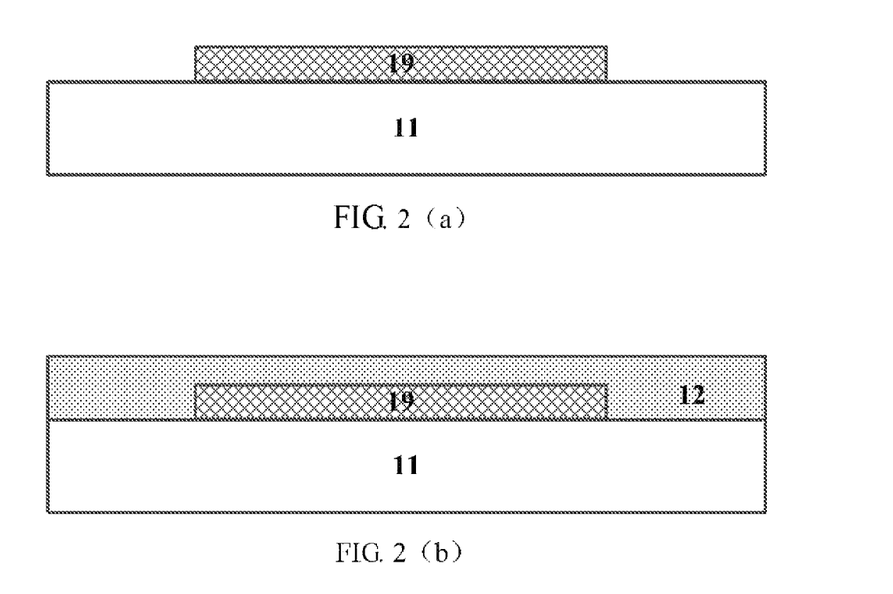
FIG. 2(a) is a first schematic view showing the manufacturing process according to the first embodiment of the present invention.
FIG. 2(b) is a second schematic view showing the manufacturing process according to the first embodiment of the present invention.
FIG. 2(c) is a third schematic view showing the manufacturing process according to the first embodiment of the present invention.
FIG. 2(d) is a fourth schematic view showing the manufacturing process according to the first embodiment of the present invention.
FIG. 2(e) is a fifth schematic view showing the manufacturing process according to the first embodiment of the present invention.
FIG. 2(f) is a sixth schematic view showing the manufacturing process according to the first embodiment of the present invention.
FIG. 2(g) is a seventh schematic view showing the manufacturing process according to the first embodiment of the present invention.
FIG. 2(h) is the eighth schematic view showing the manufacturing process according to the first embodiment of the present invention.
FIG. 2(i) is a ninth schematic view showing the manufacturing process according to the first embodiment of the present invention.

Furthermore, the first embodiment of the present invention further provides a method for manufacturing the array substrate. In particularly, the method for manufacturing the array substrate according to the first embodiment of the present invention will be described hereinafter with reference to FIGS. 2(a) to 2(i). The method for manufacturing the array substrate can be carried out as follows:

Step 101: forming a common electrode layer 19 on a base substrate, as illustrated in FIG. 2(a).

For example, the base substrate 11 may be a glass substrate, a plastic substrate, or the like and there is no limitation thereto in the embodiment of the present invention. Furthermore, prior to forming the common electrode 19 on the base substrate 11, a process for pre-washing the base substrate 11 can be conducted. Then the common electrode film layer may formed on the base substrate 11 by deposition, sputtering or the like, and the common electrode layer 19 in a predetermined pattern is formed on the base substrate 11 by a patterning process, which comprises photoresist applying, exposing, developing, etching, removing of the photoresist, and so on, it will not further described herein.

Furthermore, the pattern of the common electrode layer 19 may partially overlap with the base substrate 11. In order to increase the storage capacitance of the array substrate, in the embodiment of the present invention, the pattern for the common electrode layer 19 generally may comply with the following conditions: the horizontal projection area of the common electrode layer 19 on the base substrate 11 respectively overlaps with the horizontal projection area of the pixel electrode layer 18 on the base substrate 11 and the projection area of the semiconductor layer 13 on the base substrate. In this way, the common electrode layer 19 forms a storage capacitor not only with the pixel electrode layer 18, but also with the semiconductor layer 13, and hence the storage capacitance of the array substrate is increased, and the performance of the array substrate and the resultant display device product is improved.

It is to be noted that the pattern for the common electrode layer 19 may fully cover the base substrate 11, in which case one patterning process can be omitted, but some undesirable parasite capacitance may be generated. Therefore, it is preferred that the pattern for the common electrode layer 19 partially covers the base substrate 11, and moreover there is overlapping between the horizontal projection area of the common electrode layer on the base substrate 11 and the horizontal projection area of the pixel electrode layer 18 on the base substrate 11 and the horizontal projection area of the semiconductor layer 13 on the base substrate 11, respectively.

Step 102: forming a buffer layer 12 on the common electrode layer 19, as illustrated in FIG. 2(b).

For example, in the embodiment of the present invention, the buffer layer 12 may be deposited on the common electrode layer 19 by CVD (chemical vapor deposition), and the like. Furthermore, the buffer layer 12 may an insulation double-layer structure comprising a silicon nitride film layer and a silicon oxide film layer, or may be an insulation single layer structure comprising a silicon nitride film layer or a silicon oxide film layer, there is no limitation thereto in the embodiment of the present invention.

Figure 2C:
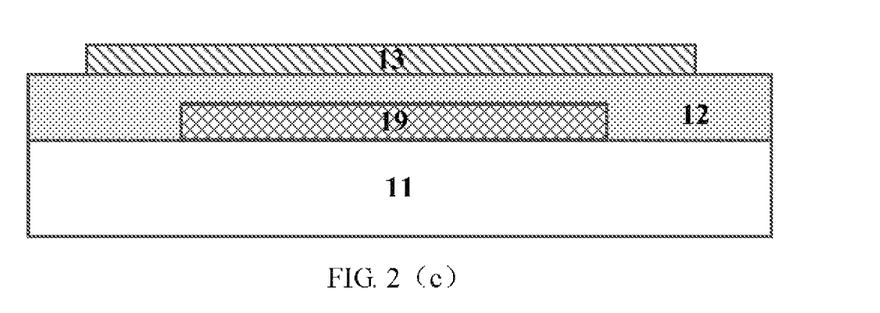

Step 103: forming a semiconductor layer 13 on the buffer layer 12, as illustrated in FIG. 2(c).

For example, the semiconductor layer 13 may be a poly-silicon layer or an amorphous silicon layer. When the semiconductor layer 13 is poly-silicon layer, a amorphous silicon layer may be deposited on the buffer layer 12 by using CVD method or the like, and then the amorphous silicon is crystallized by using ELA (?) or SPC (?), or the like method. After that, the desired poly-silicon pattern is formed by the patterning processes comprising photoresist applying, exposure, development, etching, photoresist removing, and so on.

Figure 2D:
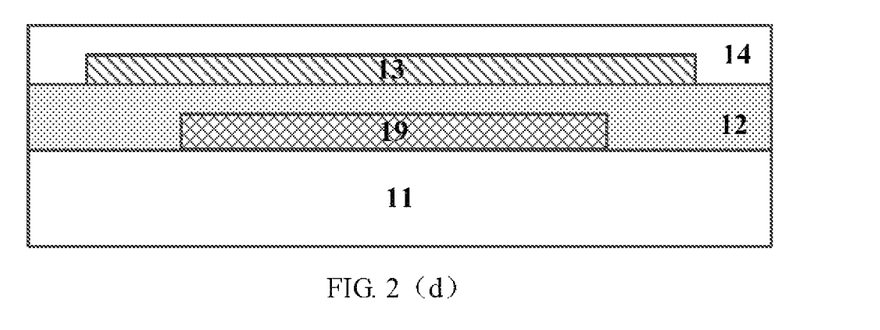

Step 104: forming a gate insulation layer 14 on the semiconductor layer 13, as illustrated in FIG. 2(d).

For example, the gate insulation layer 14 may be deposited on the semiconductor layer 13 by using a CVD method or the like. Furthermore, the gate insulation layer 14 may be a silicon oxide layer, a silicon nitride layer, or a composite layer comprising a silicon oxide layer and a silicon nitride layer, there is no limitation thereto in the embodiment of the present invention.

Figure 2E:
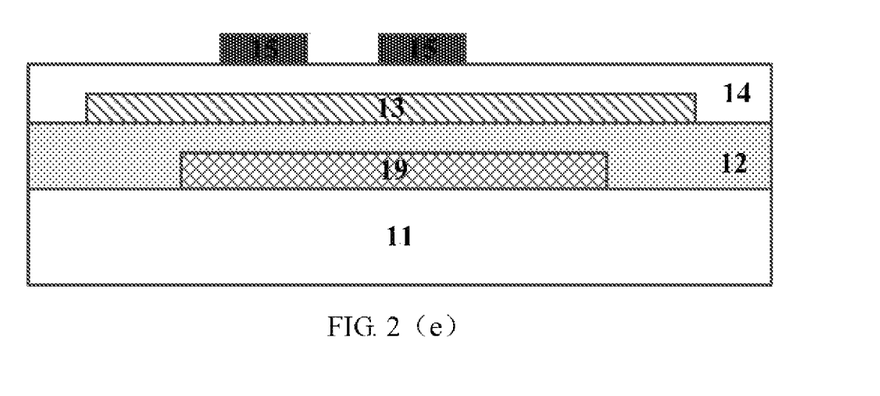

Step 105: forming a gate metal layer 15 on the gate insulation layer 14, as illustrated in FIG. 2(e).

For example, the gate metal layer 15 may include the patterns for a gate electrode, a gate line and a common electrode line, for which further description is not given herein. And when the gate metal layer 15 is formed on the gate insulation layer 14, firstly, a metal layer may be formed on the gate insulation layer 14 by PVD (physical vapor deposition), and then by the patterning processes comprising photoresist applying, exposure, development, etching, photoresist removing and so on, the gate electrode, the gate line and the common electrode line can be formed on the gate insulation layer 14 at the same time.

For example, the metal layer may be an aluminum layer, a tungsten layer, a chromium layer, or other metal or metal compound conductive layer, and there is no limitation thereto in the embodiment of the present invention.

Step 106: forming an interlayer dielectric layer 16 on the gate metal layer 15, as illustrated in FIG. 2(f).

For example, the interlayer dielectric layer 16 may be deposited on the gate metal layer 15 by CVD, to protect the gate metal layer 15 and isolate the gate metal layer 15 from the subsequent source/drain metal layer 17. The interlayer dielectric layer 16 may be formed by silicon oxide, silicon nitride or the like, and there is no limitation thereto in the embodiment of the present invention.

Step 107: forming a source electrode via and a drain electrode via extending up to the semiconductor layer 13 in the interlayer dielectric layer 16 and the gate insulation layer 14, as illustrated in FIG. 2(g).

For example, the source electrode via 161 and the drain electrode via 162 leading to the semiconductor layer 13 can be formed in the interlayer dielectric layer 16 and the gate insulation layer 14 by one or more patterning processes, and there is no limitation thereto in the embodiment of the present invention.

Step 108: in the source electrode via 161, the drain electrode via 162 and on the interlayer dielectric layer 16 in which the source electrode via 161 and the drain electrode via 162 are provided, forming a source/drain metal layer 17 comprising a source electrode 171 and a drain electrode 172, as illustrated in FIG. 2(h).

For example, in the step 108, a conductive material is deposited on the interlayer dielectric layer 16 comprising the source electrode via 161 and the drain electrode via 162 therein, and then the source/drain metal layer 17 comprising the source electrode 171 and the drain electrode 172 can be formed by a patterning process comprising photoresist applying, exposure, development, etching, photoresist removing, or the like.

For example, the conductive material may be aluminum, tungsten, chromium, or other metal or metal compound; there is no limitation thereto in the embodiment of the present invention.

It is to be noted that, since the source/drain metal layer 17 generally includes the source electrode, the drain electrode and a data line, in step 108, while the source electrode 171 and the drain electrode 172 are formed, the data line may be formed at the same time. It will not further described therein.

Step 109: forming a pixel electrode layer 18 on the source/drain metal layer 17, as illustrated in FIG. 2(i).

For example, a layer of transparent conductive material is deposited on the source/drain metal layer 17 by a CVD method or the like, and the pixel electrode layer 18 with a predetermined pattern can be obtained by the patterning processes comprising photoresist applying, exposure, development, etching, photoresist removing and so on.

It is to be noted that the resultant pixel electrode layer 18 typically is electrically connected with the drain electrode 172 in the source/drain metal layer 17, and it will not be further described herein.

Figure 3:
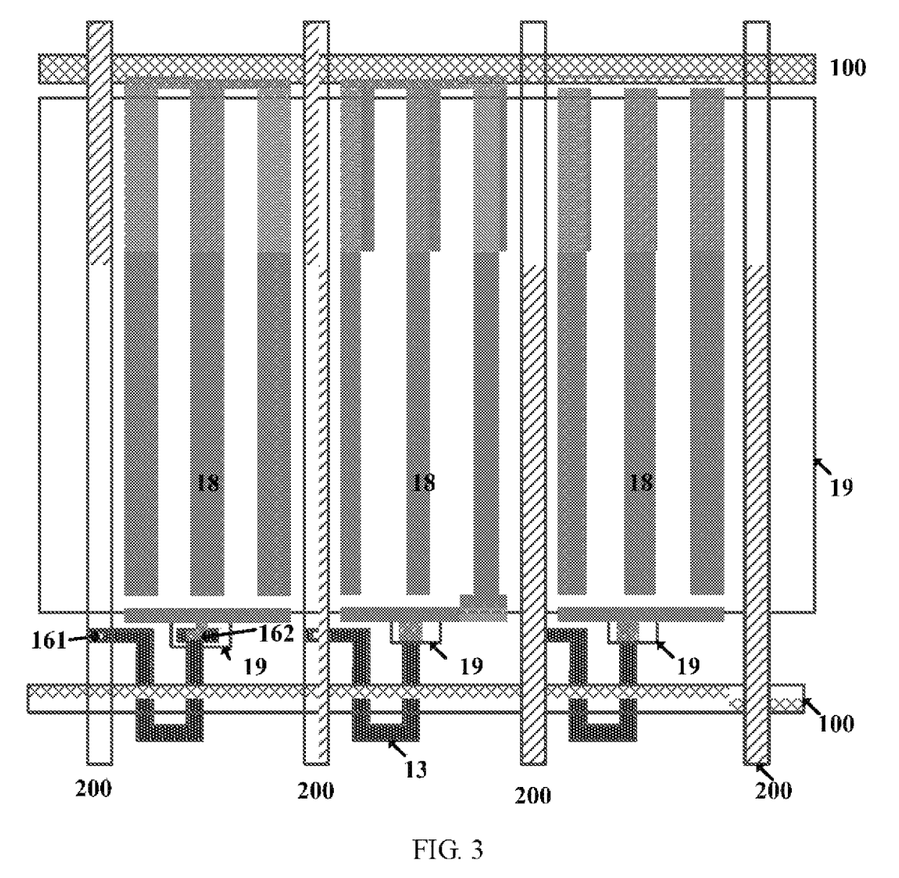
FIG. 3 is a schematic view showing the planer structure of the array substrate according to the first embodiment of the present invention.

That is to say, after the above steps 101 to 109, the array substrate according to an embodiment of the present invention is obtained, and the planer structure schematic view of the resultant array substrate is illustrated in FIG. 3, in which every layer structure is illustrated in a transparent or semi-transparent form for the purpose of clarity. As illustrated in FIG. 3, a plurality of pixel units are defined at the intersections of the gate lines 100 and the data lines 200, and each of the pixel unit includes a thin film transistor, the pixel electrode layer 18, the common electrode layer 19, and so on. Each of the thin film transistors includes a gate electrode, a semiconductor layer, a source electrode and a drain electrode. For example, the gate electrode is part of the gate line 100, and the pixel electrode in the pixel electrode layer 18 is a comb-like electrode. In each of the pixel unit, the common electrode layer (Vcom) 19, besides being located under the pixel electrode layer 18, is further extended to the beneath of the semiconductor layer 13 at one side of the pixel electrode layer 18, in which case the common electrode layer 18 not only forms a storage capacitor with the pixel electrode layer 18, but also forms a storage capacitor with the semiconductor layer 13, and therefore, the object of increasing the storage capacitance of the array substrate and improving the performance of the array substrate and the display device can be achieved, besides the manufacturing process and the film layer structure for the array substrate being simplified.

In the method for manufacturing the array substrate as provided in the first embodiment of the present invention, the array substrate includes the base substrate, and the buffer layer, the semiconductor layer, the gate insulation layer, the gate metal layer, the interlayer dielectric layer, the source/drain metal layer and the pixel electrode layer subsequently formed on the base substrate, and further includes the common electrode layer formed between the base substrate and the buffer layer. Since the common electrode layer is formed on the base substrate before forming the buffer layer, the common electrode layer not only forms a storage capacitor with the pixel electrode layer, but also forms a storage capacitor with the semiconductor layer, thus functions to increase the storage capacitance of the array substrate, improve the maintenance ratio of pixel voltage of the array substrate, suppress the unfavorable phenomenon like flicker of the display device, and improve the quality of the array substrate and the display device. In addition, compared with the manufacturing method in a conventional technology, because the processes for subsequently forming a protection layer and a passivation layer can be omitted, thus the film layer structure of the array substrate as well as the manufacturing process therefor can be simplified.

It is to be noted that the embodiment of the present invention is described by taking the top-gate type TFT comprising a poly-silicon layer as an example, the embodiment of the present invention is equally applied to other type of TFT in which the semiconductor layer is formed of an amorphous silicon layer, and for the bottom-gate type TFT or other structural variations of TFT, as long as the storage capacitance is increased by increasing the confronting area, it would fall within the scope of the embodiments of the present invention.

Second Embodiment

The second embodiment of the present invention provides a display device, the display device may be an kind of product or component having display function, such as liquid crystal display panel, electronic paper, OLED (organic light-emitting diode) panel, mobile phone, tablet computer, television, monitor, laptop computer, digital frame, navigator and so on, and there is no limitation thereto in the embodiment of the present invention. The display device includes an array substrate as described in the first embodiment of the present invention, and will be not further described herein.

It is to be noted that the display device according to the present invention may be of TN (twisted nematic) mode, VA (vertical alignment) mode, IPS (in-plane switching) mode or ADS (Advanced super dimension switch) mode, and there is no limitation thereto in the embodiment of the present invention. Preferably, the display device according to the present invention is especially suitable to IPS mode and ADS mode.

What are described above is related to the illustrative embodiments of the disclosure only and not limitative to the scope of the disclosure; the scopes of the disclosure are defined by the accompanying claims.

The invention claimed is:

1. An array substrate comprising a base substrate, and a buffer layer that is formed on the base substrate,
a semiconductor layer that is formed on the buffer layer,
a gate insulation layer that is formed on the semiconductor layer,
a gate metal layer that is formed on the gate insulation layer,
an interlayer dielectric layer that is formed on the gate metal layer,
a source/drain metal layer that is formed on the interlayer dielectric layer,
a pixel electrode layer that is formed on the source/drain metal layer, and
a common electrode layer that is formed between the base substrate and the buffer layer,
wherein the common electrode layer comprises a main body disposed under the pixel electrode layer and a protrusion portion disposed under the semiconductor layer,
wherein the protrusion portion protrudes from the main body and overlaps with the semiconductor layer in a thickness direction of the base substrate; and
wherein the common electrode layer is formed by a transparent conductive material.

2. The array substrate as claimed in claim 1, wherein a horizontal projection area of the common electrode layer on the base substrate overlaps with a horizontal projection area of the pixel electrode layer on the base substrate and a horizontal projection area of the semiconductor layer on the base substrate, respectively.

3. The array substrate as claimed in claim 2, wherein the semiconductor layer is poly-silicon layer.

4. The array substrate as claimed in claim 2, wherein the source/drain metal layer comprises patterns of a source electrode, a drain electrode and a data line, the interlayer dielectric layer and the gate insulation layer are respectively formed therein with a source electrode via and a drain electrode via for respectively electrically connecting the source electrode and the drain electrode with the semiconductor layer.

5. The array substrate as claimed in claim 1, wherein the semiconductor layer is poly-silicon layer.

6. The array substrate as claimed in claim 5, wherein the source/drain metal layer comprises patterns of a source electrode, a drain electrode and a data line, the interlayer dielectric layer and the gate insulation layer are respectively formed therein with a source electrode via and a drain electrode via for respectively electrically connecting the source electrode and the drain electrode with the semiconductor layer.

7. The array substrate as claimed in claim 1, wherein the source/drain metal layer comprises patterns of a source electrode, a drain electrode and a data line, the interlayer dielectric layer and the gate insulation layer are respectively formed therein with a source electrode via and a drain electrode via for respectively electrically connecting the source electrode and the drain electrode with the semiconductor layer.

8. The array substrate as claimed in claim 1, wherein the transparent conductive material is indium tin oxide.

9. A display device comprising the array substrate as claimed in claim 1.

10. A method for manufacturing an array substrate comprising the steps of:
- forming a common electrode layer on a base substrate; and
- forming a buffer layer on the common electrode layer, forming a semiconductor layer on the buffer layer, forming a gate insulation layer on the semiconductor layer, forming a gate metal layer on the gate insulation layer, forming an interlayer dielectric layer on the gate insulation layer, forming a source/drain metal layer on the interlayer dielectric layer and forming a pixel electrode layer on the source/drain metal layer, wherein the common electrode layer comprises a main body disposed under the pixel electrode layer and a protrusion portion disposed under the semiconductor layer,
- wherein the protrusion portion protrudes from the main body and overlaps with the semiconductor layer in a thickness direction of the base substrate; and
- wherein the common electrode layer is formed by a transparent conductive material.

11. The method as claimed in claim 10, wherein a horizontal projection area of the common electrode layer on the base substrate overlaps with a horizontal projection area of the pixel electrode layer on the base substrate and a horizontal projection area of the semiconductor layer on the base substrate, respectively.

12. The method as claimed in claim 10, wherein the semiconductor layer is a poly-silicon layer.

13. The method as claimed in claim 10, wherein the source/drain metal layer comprises patterns of a source electrode, a drain electrode and a data line; and after forming the interlayer dielectric layer and prior to forming the source/drain metal layer, the method further includes:
- forming a source electrode via and a drain electrode via in the interlayer dielectric layer and the gate insulation layer for respectively electrically connecting the source electrode and the drain electrode with the semiconductor layer.

* * * * *